(12) United States Patent
Kusaka

(10) Patent No.: US 11,237,487 B2
(45) Date of Patent: Feb. 1, 2022

(54) IMPRINT APPARATUS AND ARTICLE MANUFACTURING METHOD

(71) Applicant: CANON KABUSHIKI KAISHA, Tokyo (JP)

(72) Inventor: Atsushi Kusaka, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/195,001

(22) Filed: Mar. 8, 2021

(65) Prior Publication Data

US 2021/0294224 A1 Sep. 23, 2021

(30) Foreign Application Priority Data

Mar. 18, 2020 (JP) .............................. JP2020-048025

(51) Int. Cl.
*G03F 7/20* (2006.01)
*G03F 7/00* (2006.01)

(52) U.S. Cl.
CPC ........ *G03F 7/70625* (2013.01); *G03F 7/0002* (2013.01); *G03F 7/70716* (2013.01); *G03F 7/70775* (2013.01)

(58) Field of Classification Search
CPC ............... G03F 7/70625; G03F 7/7002; G03F 7/70716; G03F 7/70775
See application file for complete search history.

(56) References Cited

U.S. PATENT DOCUMENTS

| 5,420,663 | A | * | 5/1995 | Nakajima | ............. | G03F 7/2022 |
| | | | | | | 355/50 |
| 5,929,976 | A | * | 7/1999 | Shibuya | ................ | G03F 7/2028 |
| | | | | | | 355/53 |
| 11,131,924 | B2 | * | 9/2021 | Sato | ...................... | G03F 7/0002 |

FOREIGN PATENT DOCUMENTS

JP 2019062164 A 4/2019

* cited by examiner

*Primary Examiner* — Hung Nguyen
(74) *Attorney, Agent, or Firm* — Rossi, Kimms & McDowell LLP

(57) ABSTRACT

The present invention provides an imprint apparatus that forms a pattern of an imprint material on a substrate using a mold, the apparatus including a first detection unit configured to detect a surface structure in a wafer edge region of the substrate, a specifying unit configured to specify, from the surface structure detected by the first detection unit, an effective region in which the pattern of the imprint material is formed, and a first determining unit configured to determine, based on the effective region specified by the specifying unit, a shape of a peripheral shot region whose area is smaller than an area of a pattern region of the mold, and a second determining unit configured to determine based on the shape determined by the first determining unit, a supply position of the imprint material in the peripheral shot region.

10 Claims, 8 Drawing Sheets

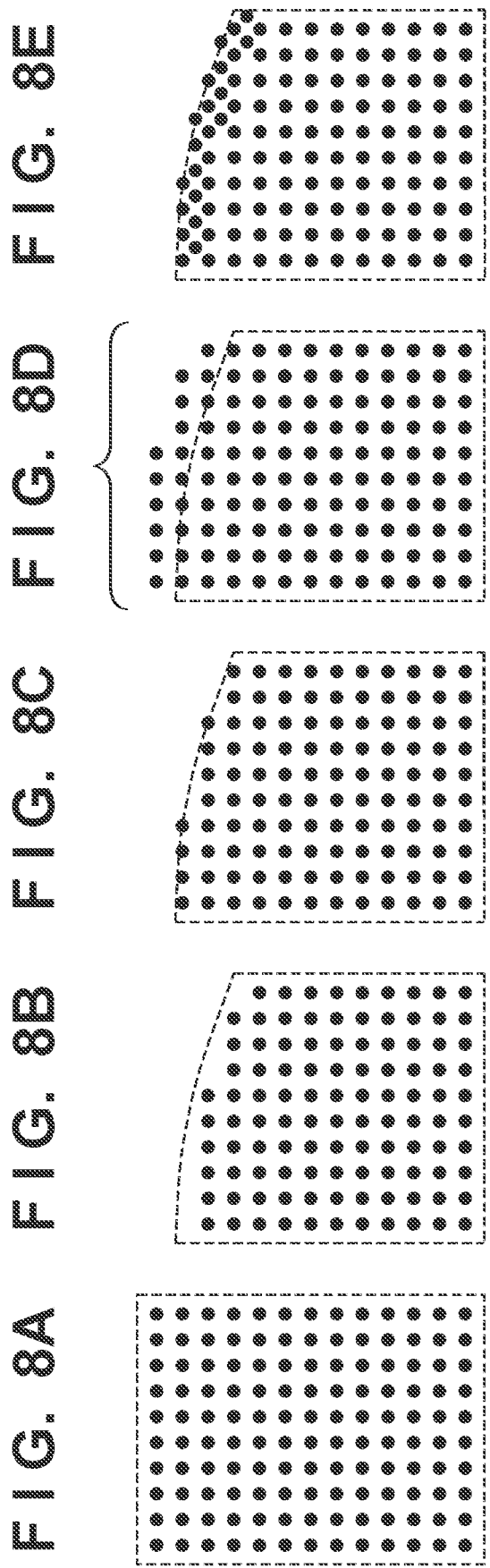

IMPRINT APPARATUS AND ARTICLE MANUFACTURING METHOD

BACKGROUND OF THE INVENTION

Field of the Invention

The present invention relates to an imprint apparatus and an article manufacturing method.

Description of the Related Art

An imprint technique is a technique that enables transfer of a fine nanoscale pattern, and has been proposed as one of lithography techniques for mass production of semiconductor elements, liquid crystal display elements, or magnetic storage media. An imprint apparatus using the imprint technique cures an imprint material in a state in which a mold formed with a pattern and the imprint material on a substrate are in contact with each other and separates the mold from the cured imprint material, thereby forming the pattern on the substrate. As a method of curing the imprint material, the imprint apparatus generally employs a photo-curing method in which the imprint material is cured by irradiation of light (ultraviolet light or the like).

In the imprint apparatus, the imprint material is supplied (arranged) onto the substrate by discharging droplets of the imprint material from a dispenser in accordance with a drop pattern determined in advance. The drop pattern is determined in consideration of, for example, the underlying pattern of the substrate (the pattern formed on the substrate), the pattern of the mold, the shot size, the shot array on the substrate, and the like, as disclosed in Japanese Patent Laid-Open No. 2019-62164.

In the related art, the drop pattern to be applied to a shot region in a peripheral portion of the substrate, which is a so-called peripheral shot region (PE: Partial Field), is provided in accordance with the designed coordinates (shot array and shot shape) on the substrate.

When an imprint process is performed on a substrate including an underlying pattern, the imprint material is supplied based on not the substrate but the underlying pattern (that is, while being aligned with the underlying pattern). When an imprint process is performed on a substrate including no underlying pattern, the imprint material is supplied based on not the substrate but the coordinate system of a substrate stage holding the substrate.

In general, the center of the underlying pattern and the center of the substrate do not match. This is due to the influence of an error upon forming the underlying pattern on the substrate. A shift between the center of the underlying pattern and the center of the substrate is about 100 µm. In addition, a pattern region with the underlying pattern formed therein (a region where the effective underlying pattern exists) is also influenced by an error caused by the formation process of the underlying pattern. More specifically, the shape of the pattern region of the underlying pattern may be shifted from a designed value, for example, a perfect circle with a diameter of 294 mm, and become an elliptical shape, or the center of the pattern region of the underlying pattern may not match the center of the substrate. The shift between the center of the pattern region of the underlying pattern and the center of the substrate is about 500 µm. Further, the shape (outer shape) of the substrate itself may be influenced by a manufacturing error and shifted from a designed value, for example, a perfect circle with a diameter of 300 mm, and become an elliptical shape. Such a shift is about 200 µm.

Here, consider a case in which the center of the substrate pattern, the center of the underlying pattern, and the center of the pattern region of the underlying pattern, and shapes do not match as has been described above. In this case, in some peripheral shot regions, the imprint material is insufficient for the shot area, and in the peripheral shot regions located symmetrically with respect to the center of the substrate, the imprint material excessive for the shot area is supplied. Further, also in a case in which the shape of the substrate itself is shifted, the imprint material is excessive or insufficient for the shot area in some peripheral shot regions.

If the imprint material is insufficient for the shot area, when the mold and the imprint material on the substrate are brought into contact with each other, the pattern (concave portion) of the mold is insufficiently filled with the imprint material, and transfer defect may occur in the pattern formed on the substrate. Further, in an extreme case, the mold and the substrate may directly contact with each other and the mold or the substrate may be damaged. On the other hand, if the imprint material excessive for the shot area is supplied, the imprint material may be supplied to an edge of the substrate or the outside of the substrate, and contaminate a substrate conveyance hand or the substrate stage.

SUMMARY OF THE INVENTION

The present invention provides an imprint apparatus advantageous in determining a supply position of an imprint material in a peripheral shot region.

According to one aspect of the present invention, there is provided an imprint apparatus that forms a pattern of an imprint material on a substrate using a mold, the apparatus including a first detection unit configured to detect a surface structure in a wafer edge region of the substrate, a specifying unit configured to specify, from the surface structure detected by the first detection unit, an effective region in which the pattern of the imprint material is formed, and a first determining unit configured to determine, based on the effective region specified by the specifying unit, a shape of a peripheral shot region whose area is smaller than an area of a pattern region of the mold, and a second determining unit configured to determine, based on the shape determined by the first determining unit, a supply position of the imprint material in the peripheral shot region.

Further aspects of the present invention will become apparent from the following description of exemplary embodiments with reference to the attached drawings.

BRIEF DESCRIPTION OF THE DRAWINGS

FIGS. 8A to 8E are views each showing an example of the supply position of an imprint material in a peripheral shot region.

DESCRIPTION OF THE EMBODIMENTS

Figure 1:
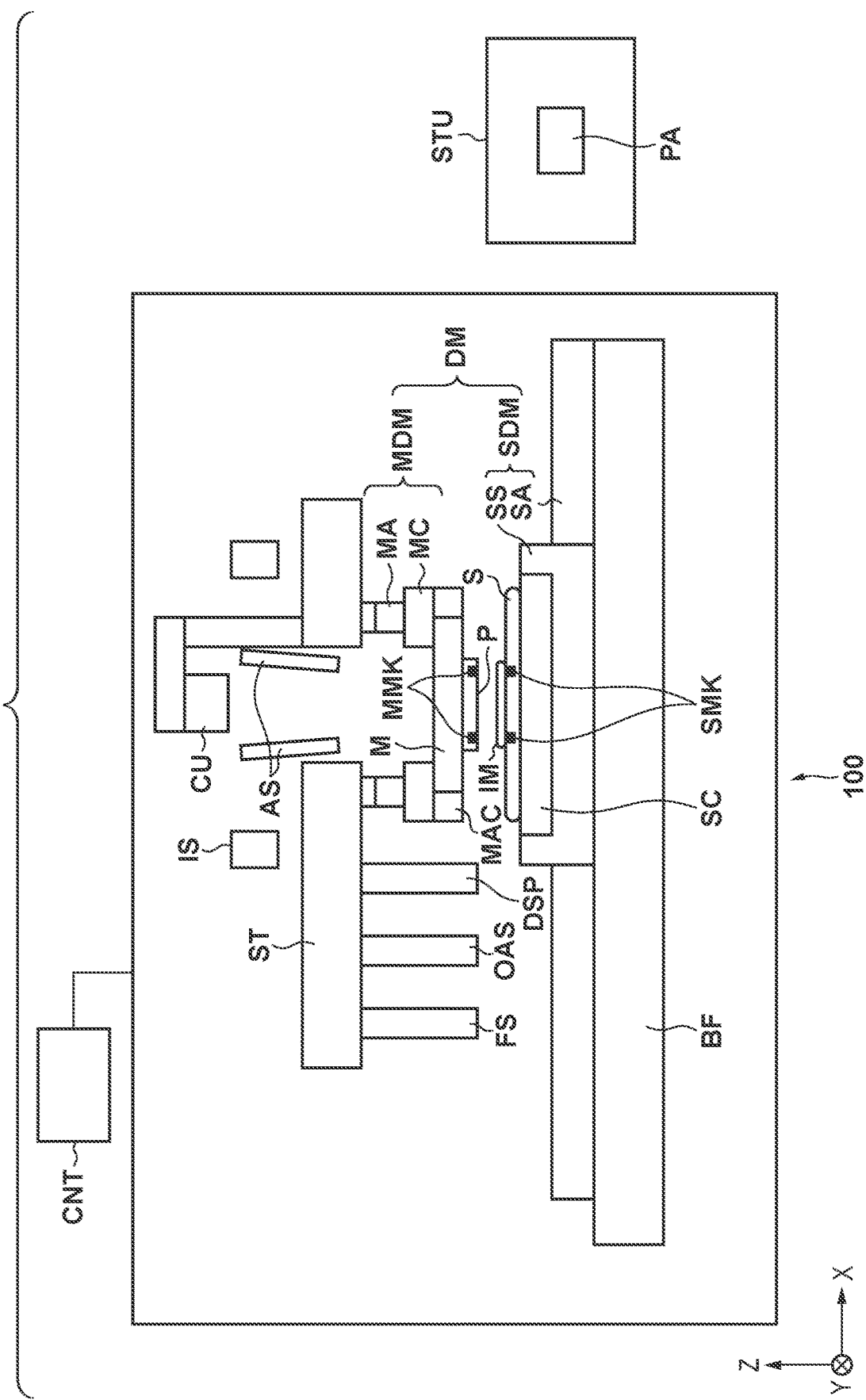
FIG. 1 is a schematic view illustrating configurations of an imprint apparatus as one aspect of the present invention.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

FIG. 1 is a schematic view illustrating configurations of an imprint apparatus 100 as one aspect of the present invention. The imprint apparatus 100 is adopted in a lithography step which is a manufacturing step of a device such as a semiconductor element, a liquid crystal display element, or a magnetic storage medium as an article. The imprint apparatus 100 is a lithography apparatus that forms a pattern on a substrate, and more specifically, forms a pattern of an imprint material on a substrate using a mold as an imprint process. The imprint apparatus 100 brings an uncured imprint material supplied onto a substrate into contact with a mold and applies curing energy to the imprint material, thereby forming a pattern of a cured product with the pattern of the mold transferred thereto. The mold is also referred to as a template, a mold, or an original.

The imprint process includes a contact process, an alignment process, a curing process, and a separation process. The contact process is a process of bringing an imprint material on a substrate (on a shot region) into contact with a mold (pattern region). The alignment process is a process of aligning the substrate and the mold. The alignment process sometimes includes a process of deforming the pattern region of the mold so as to reduce an overlay error (shape difference) between the shot region on the substrate and the pattern region of the mold. The curing process is a process of curing the imprint material in a state in which the imprint material on the substrate and the mold are in contact with each other. The separation process is a process of separating the mold from the cured imprint material (a pattern formed of a cured product of the imprint material).

In the specification and the accompanying drawings, directions will be indicated on an XYZ coordinate system in which directions parallel to the surface of a substrate are defined as the X-Y plane. Directions parallel to the X-axis, the Y-axis, and the Z-axis of the XYZ coordinate system are the X direction, the Y direction, and the Z direction, respectively. A rotation about the X-axis, a rotation about the Y-axis, and a rotation about the Z-axis are θX, θY, and θZ, respectively.

As the imprint material, a curable composition (to be also referred to as a resin in an uncured state) to be cured by receiving curing energy is used. An example of the curing energy that is used is electromagnetic waves and the like. As the electromagnetic waves, for example, infrared light, visible light, ultraviolet light, and the like selected from the wavelength range of 10 nm (inclusive) to 1 mm (inclusive) is used.

The curable composition is a composition cured by light irradiation. The photo-curable composition cured by light irradiation contains at least a polymerizable compound and a photopolymerization initiator, and may contain a nonpolymerizable compound or a solvent, as needed. The nonpolymerizable compound is at least one type of material selected from a group comprising of a sensitizer, a hydrogen donor, an internal mold release agent, a surfactant, an antioxidant, a polymer component, and the like.

The imprint material may be applied in a film shape onto the substrate by a spin coater (spin coating method) or a slit coater (slit coating method). The imprint material may be applied, onto the substrate, in a droplet shape or in an island or film shape formed by connecting a plurality of droplets using a liquid injection head. The viscosity (the viscosity at 25° C.) of the imprint material is, for example, 1 mPa·s (inclusive) to 100 mPa·s (inclusive).

As the substrate, glass, ceramic, a metal, a semiconductor, a resin, or the like is used, and a member made of a material different from that of the substrate may be formed on the surface of the substrate, as needed. More specifically, examples of the substrate include a silicon wafer, a semiconductor compound wafer, silica glass, and the like.

The imprint apparatus 100 includes a substrate driving unit SDM that holds and drives a substrate S, a base frame BF that supports the substrate driving unit SDM, a mold driving unit MDM that holds and drives a mold M, and a structure ST that supports the mold driving unit MDM. The substrate driving unit SDM includes a substrate stage SS including a substrate chuck SC for holding the substrate S, and a substrate positioning mechanism SA that positions the substrate S by driving the substrate stage SS. The mold driving unit MDM includes a mold chuck MC that holds the mold M, and a mold positioning mechanism MA that positions the mold M by driving the mold chuck MC.

The substrate driving unit SDM and the mold driving unit MDM form a driving mechanism DM that drives (moves) at least one of the substrate S and the mold M so as to adjust the relative position (and relative posture) between the substrate S and the mold M. Adjustment of the relative position between the substrate S and the mold M by the driving mechanism DM includes driving for bringing an imprint material IM on the substrate and the mold M into contact with each other and driving for separating the mold M from the cured imprint material IM on the substrate. Adjustment of the relative position between the substrate S and the mold M by the driving mechanism DM also includes alignment between the substrate S and the mold M. The substrate driving unit SDM is configured to drive the substrate S in a plurality of axes (for example, three axes of the X-axis, the Y-axis, and the θZ-axis, and preferably six axes of the X-axis, the Y-axis, the Z-axis, the θX-axis, the θY-axis, and the θZ-axis). The mold driving unit MDM is configured to drive the mold M in a plurality of axes (for example, three axes of the Z-axis, the θX-axis, and the θY-axis, and preferably six axes of the X-axis, the Y-axis, the Z-axis, the θX-axis, the θY-axis, and the θZ-axis).

The imprint apparatus 100 includes a dispenser DSP for supplying (arranging or distributing) the imprint material IM onto the substrate (onto a shot region). Note that the dispenser DSP may be arranged as an external apparatus of the imprint apparatus 100. The dispenser DSP discharges the imprint material IM (droplets thereof) onto the substrate S in synchronization with driving of the substrate S (substrate stage SS), for example, in accordance with a drop pattern showing an arrangement of the imprint material IM on the substrate such that the arrangement is reproduced. In the imprint apparatus 100, for example, the imprint process is performed every time the dispenser DSP supplies the imprint material IM to one shot region on the substrate. Alternatively, the imprint process may be performed on each of a plurality of shot regions after the dispenser DSP has supplied the imprint material IM to the plurality of shot regions on the substrate.

The imprint apparatus 100 further includes a curing unit CU, an off-axis scope OAS, an alignment scope AS, a focus sensor FS, a substrate conveyance unit STU, a substrate aligner PA, an image capturing unit IS, a mold deformation unit MAG, and a control unit CNT.

The curing unit CU cures the imprint material IM by irradiating the imprint material IM with curing energy (for example, light such as ultraviolet light) in a state in which the imprint material IM on the substrate S is in contact with a pattern region P of the mold M.

The off-axis scope OAS detects marks (alignment marks) SMK provided on the substrate S (shot region thereof) to measure the position of each mark SMK, that is, the position of the substrate S. In this embodiment, the off-axis scope OAS can function as a second detection unit that detects the marks SMK provided on the substrate.

The alignment scope AS detects the marks SMK provided on the substrate S and marks (alignment marks) MMK provided on the mold M (pattern region P thereof) to measure the relative position (positional shift) between the substrate S (marks SMK) and the mold M (marks MMK). In this embodiment, the alignment scope AS can function as the second detection unit that detects the marks SMK provided on the substrate. Further, in this embodiment, the alignment scope AS can function as a first detection unit that detects the surface structure in a wafer edge region of the substrate S.

The focus sensor FS includes a projection system that obliquely projects light to the surface of the substrate S, and a light receiving system that receives light reflected by the surface of the substrate S. The focus sensor FS is a measurement unit that measures the position of the substrate S in a height direction (Z direction). In this embodiment, the focus sensor FS can function as the first detection unit that detects the surface structure in a wafer edge region of the substrate S.

The substrate conveyance unit STU includes various kinds of conveyance mechanisms, hands, and the like, and conveys the substrate S to the substrate stage SS (substrate chuck SC) that functions as a substrate holding unit. The substrate aligner PA is provided in the substrate conveyance unit STU, and measures the outer shape and position of the substrate S before the substrate S is conveyed to the substrate stage SS. In this embodiment, the substrate aligner PA functions as a third detection unit that detects the position of the edge of the substrate S which defines the outer shape of the substrate S.

The image capturing unit IS captures a visual field including the pattern region P of the mold M via an optical system (not shown). Thus, the image capturing unit IS has a function of capturing the substrate S to obtain an image. For example, in a contact step, the image capturing unit IS captures an extending contact region between the imprint material IM on the substrate and the pattern region P of the mold M and interference fringes formed by a gap between the mold M and the substrate S. Further, in this embodiment, the image capturing unit IS can function as the first detection unit that detects the surface structure in a wafer edge region of the substrate S.

The mold deformation unit MAG has a function of deforming the mold M (pattern region P). In this embodiment, the mold deformation unit MAG corrects the shape of the pattern region P of the mold M, for each shot region on the substrate, so as to reduce a shape difference between the shot region and the pattern region P of the mold M. The mold deformation unit MAG deforms the pattern region P by applying a force to the mold M in a direction parallel to the pattern region P, thereby correcting the shape of the pattern region P of the mold M.

The control unit CNT operates the imprint apparatus 100 by comprehensively controlling the respective units of the imprint apparatus 100 in accordance with programs stored in the storage unit. In this embodiment, the control unit CNT controls an imprint process and processes concerning the imprint process. The control unit CNT is formed from a general-purpose or dedicated information processing apparatus (computer) installed with programs. Note that the control unit CNT may be formed from a PLD (Programmable Logic Device) such as an FPGA (Field Programmable Gate Array). Further, the control unit CNT may be formed from an ASIC (Application Specific Integrated Circuit).

Figure 2:
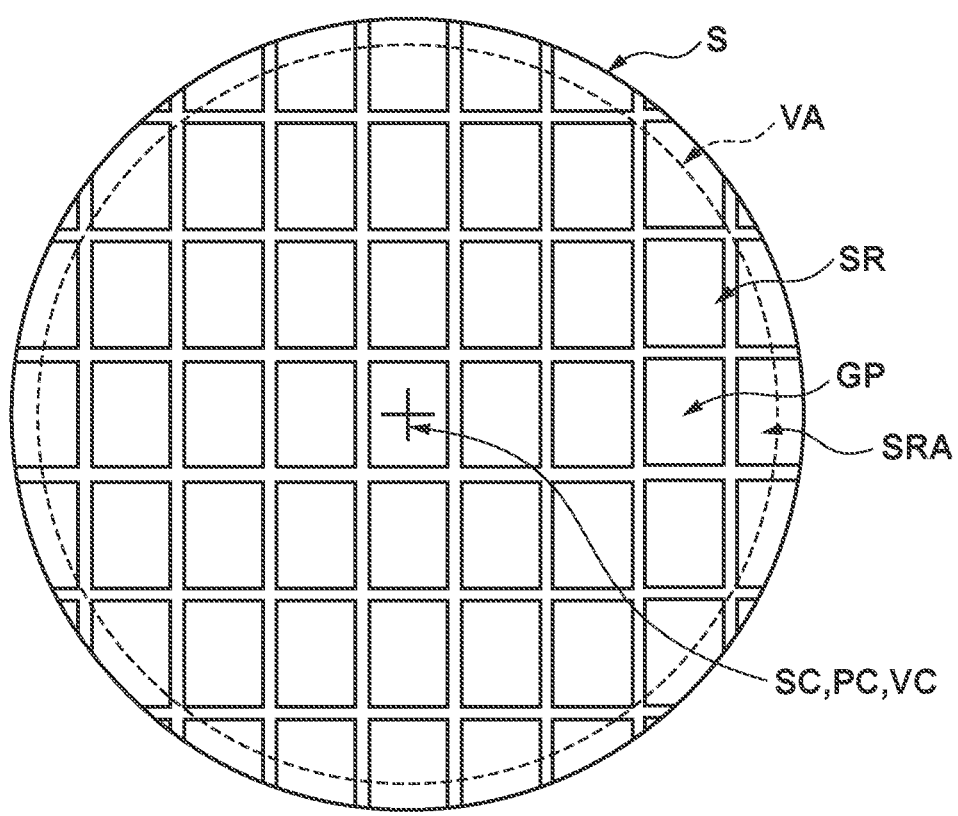
FIG. 2 is a view showing an example of the array of a plurality of shot regions on a substrate.

FIG. 2 is a view showing an example of the array of a plurality of shot regions SR on the substrate. FIG. 2 shows an ideal state in which a center (center position) SC of the substrate S, a center (center position) PC of an underlying pattern GP, and a center (center position) VC of an effective region VA match. The underlying pattern GP is a pattern already formed on the substrate S through an underlayer formation process, and determines the array of the shot regions SR. The effective region VA is a region which is determined in the underlayer formation process and to which the imprint material is to be applied (supplied), that is, in which a pattern of the imprint material is to be formed. The effective region VA is mainly influenced by spin coating of a photosensitive agent (resist) upon forming the underlying pattern GP.

Figure 3:
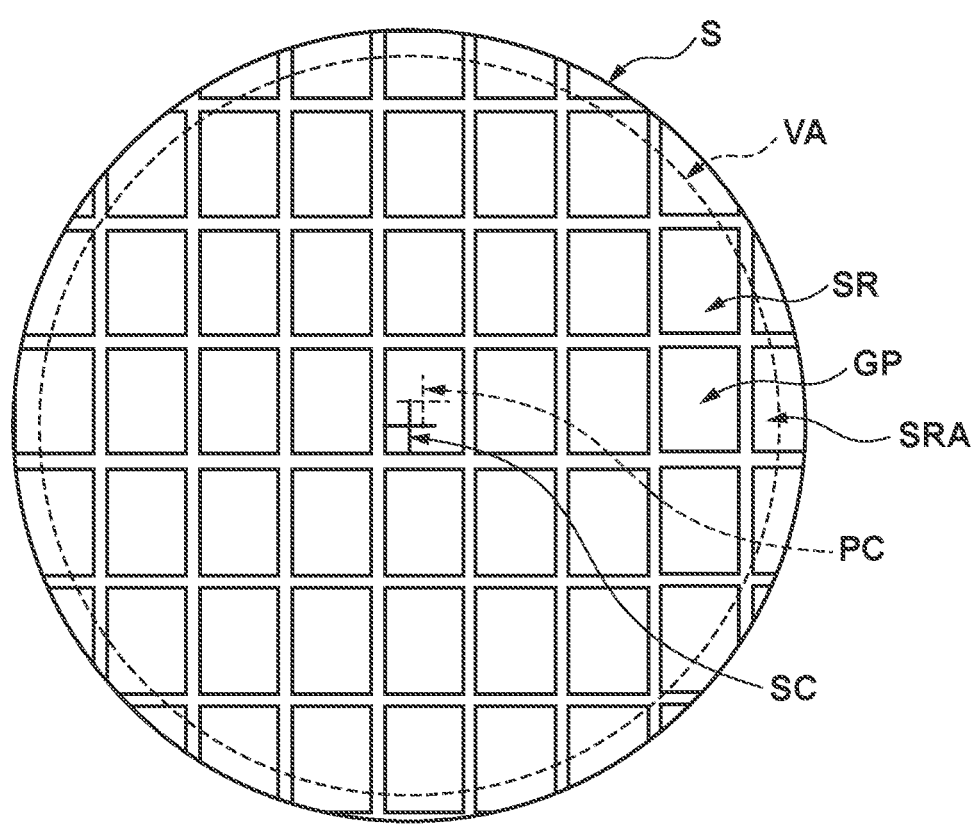
FIG. 3 is a view showing another example of the array of the plurality of shot regions on the substrate.

FIG. 3 is a view showing another example of the array of the plurality of shot regions SR on the substrate, and shows a state in which the center SC of the substrate S and the center PC of the underlying pattern GP are shifted from each other. In this case, a peripheral shot region SRA in the peripheral portion of the substrate S has a shape different from a designed shape, that is, the shape of the peripheral shot region SRA in the ideal state shown in FIG. 2. The peripheral shot region SRA is a shot region which is cut off at the edge (edge) of the substrate S, that is, a shot region whose area is smaller than the area of the pattern region P of the mold M. The peripheral shot region SRA is also referred to as a partial shot region.

Figure 4:
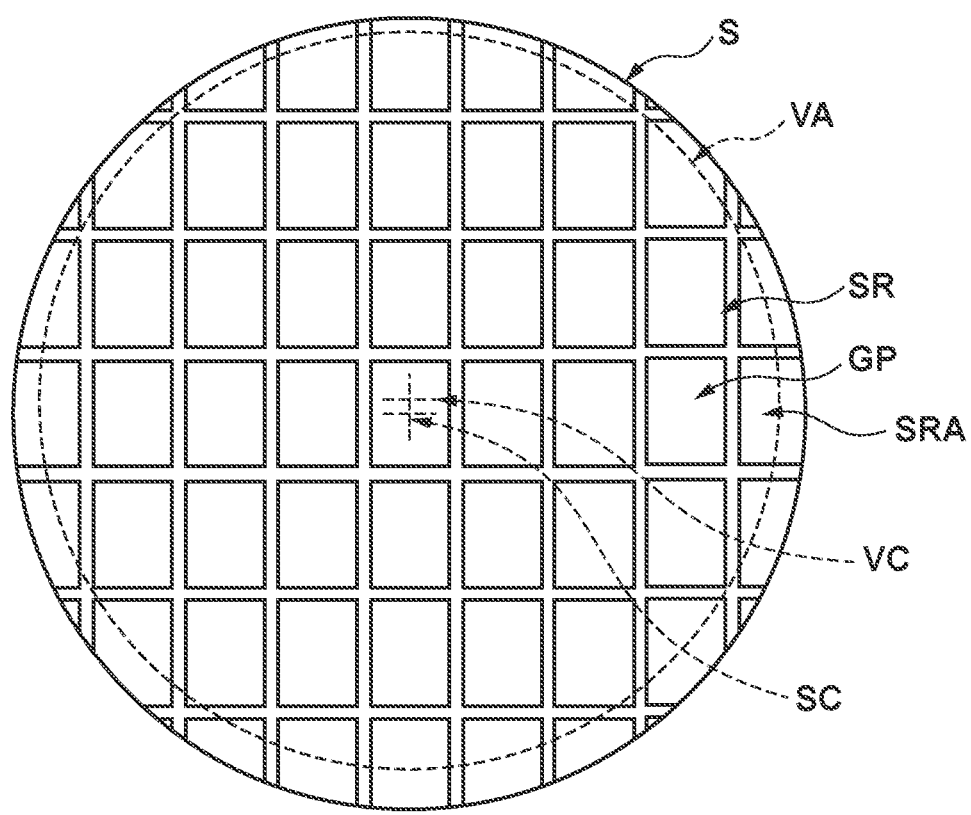
FIG. 4 is a view showing still another example of the array of the plurality of shot regions on the substrate.

FIG. 4 is a view showing still another example of the array of the plurality of shot regions SR on the substrate, and shows a state in which the center SC of the substrate S and the center VC of the effective region VA are shifted from each other. Also in this case, the peripheral shot region SRA has a shape different from the shape of the peripheral shot region SRA in the ideal state shown in FIG. 2.

Figure 5:
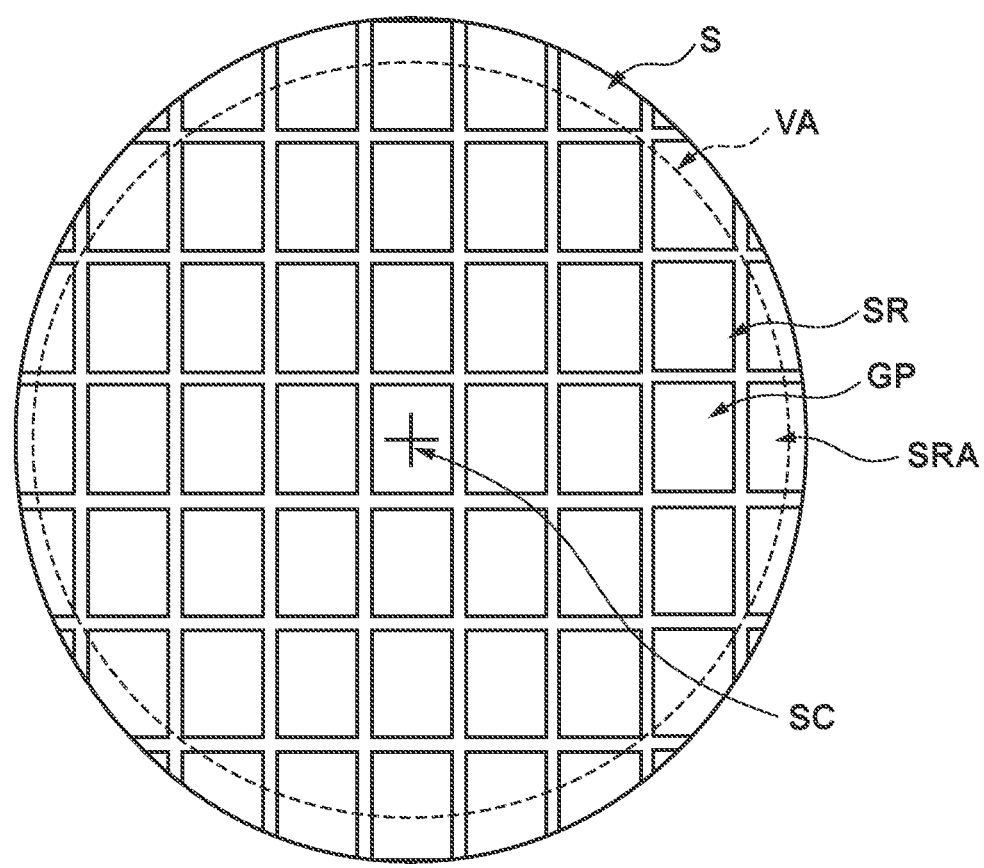
FIG. 5 is a view showing still another example of the array of the plurality of shot regions on the substrate.

FIG. 5 is a view showing still another example of the array of the plurality of shot regions SR on the substrate, and shows a state in which the substrate S has a shape (an elliptical shape in this embodiment) different from the designed shape (a circular shape in this embodiment). Also in this case, the peripheral shot region SRA has a shape different from the shape of the peripheral shot region SRA in the ideal state shown in FIG. 2.

Figure 6:
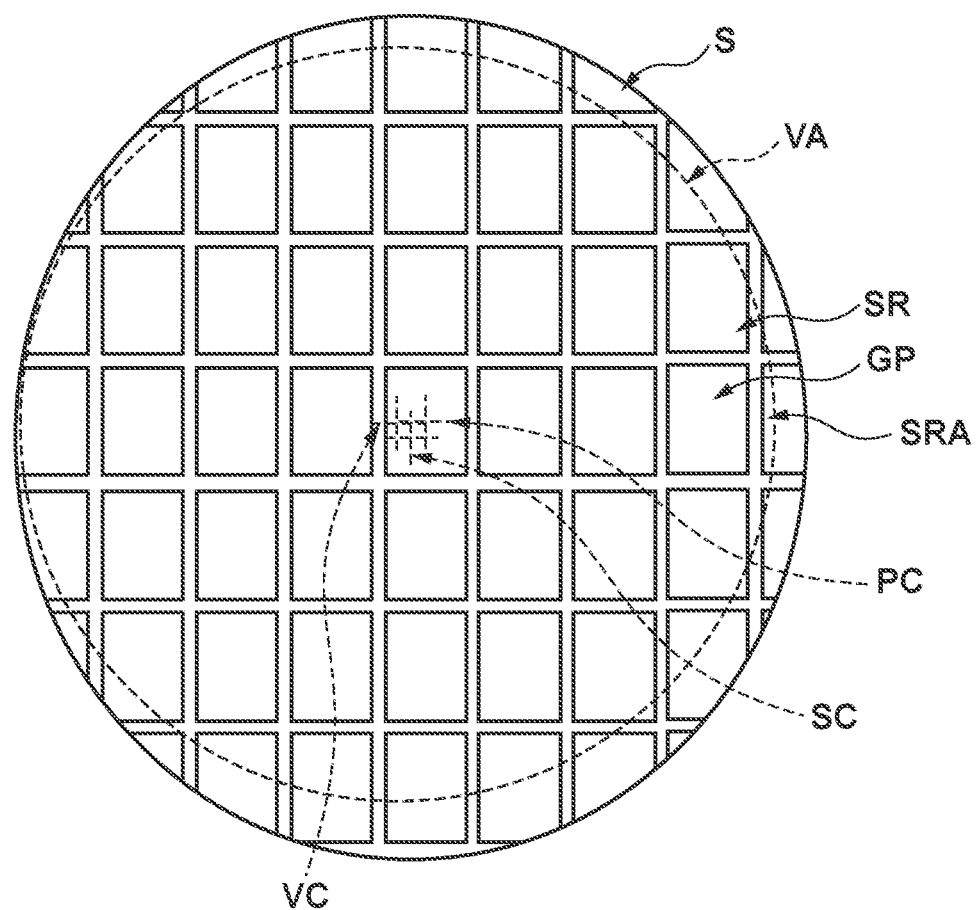
FIG. 6 is a view showing still another example of the array of the plurality of shot regions on the substrate.

FIG. 6 is a view showing still another example of the array of the plurality of shot regions SR on the substrate, and shows a state in which the center SC of the substrate S, the center PC of the underlying pattern GP, and the center VC of the effective region VA are shifted from each other and the substrate S has a shape different from the designed shape. Also in this case, the peripheral shot region SRA has a shape different from the shape of the peripheral shot region SRA in the ideal state shown in FIG. 2.

As shown in FIG. 2, in the ideal state, the center SC of the substrate, the center PC of the underlying pattern GP, and the center VC of the effective region VA match. On the other hand, in an actual case, there is no reference on the substrate when the first underlying pattern GP is formed on the substrate. Therefore, the underlying pattern GP is formed on the substrate based on position control of the substrate stage SS. In general, when the substrate S is conveyed to the substrate stage SS, the outer shape of the substrate S is first measured by the substrate aligner PA, and the center SC of the substrate S is obtained from the measurement result. Then, the substrate S is conveyed to the substrate stage SS via the substrate conveyance unit STU such that the center SC of the substrate S matches the center of the substrate stage SS (substrate chuck SC). Accordingly, due to the influence of the measurement accuracy of the outer shape of the substrate S, a shift of the outer shape of the substrate S from the designed shape, the conveyance error of the substrate S by the substrate conveyance unit STU, and the like, a shift (error) is generated between the center SC of the substrate S and the center of the substrate stage SS. Since the underlying pattern GP is formed with reference to the center of the substrate stage SS, the shift between the center SC of the substrate S and the center of the substrate stage SS becomes the shift between the center SC of the substrate S and the center PC of the underlying pattern GP. Thus, as shown in FIG. 3, this influences the shape of the peripheral shot region SRA.

Further, consider a case in which, for example, spin coating of a photosensitive agent is performed upon forming the underlying pattern GP. In this case, if the center SC of the substrate is shifted from the rotation center during coating of the photosensitive agent, as shown in FIG. 4, the position of the effective region VR is shifted, and the center VC of the effective region VR is shifted. Further, due to the influence of the decentering of the rotation center during coating or the like, the shape of the effective region VR may also be shifted from the designed shape, and this influences the shape of the peripheral shot region SRA.

Furthermore, as shown in FIG. 5, even if the designed shape of the outer shape of the substrate S is a circular shape, the outer shape may actually become an elliptical shape due to a manufacturing error or the like. Also in such a case, the shape of the peripheral shot region SRA is influenced.

To prevent this, in this embodiment, a technique is provided which is advantageous in a case in which each of the above-described error factors, that is, the center SC of the substrate S, the center PC of the underlying pattern GP, the center VC of the effective region VA, the shape of the effective region VA, and the outer shape of the substrate S has an error as shown in FIG. 6. More specifically, there is provided a technique of determining the optimal drop pattern for the peripheral shot region SRA, that is, the supply position of the imprint material IM (droplets thereof) in the peripheral shot region SRA even when the above-described error factors exist.

Figure 7:
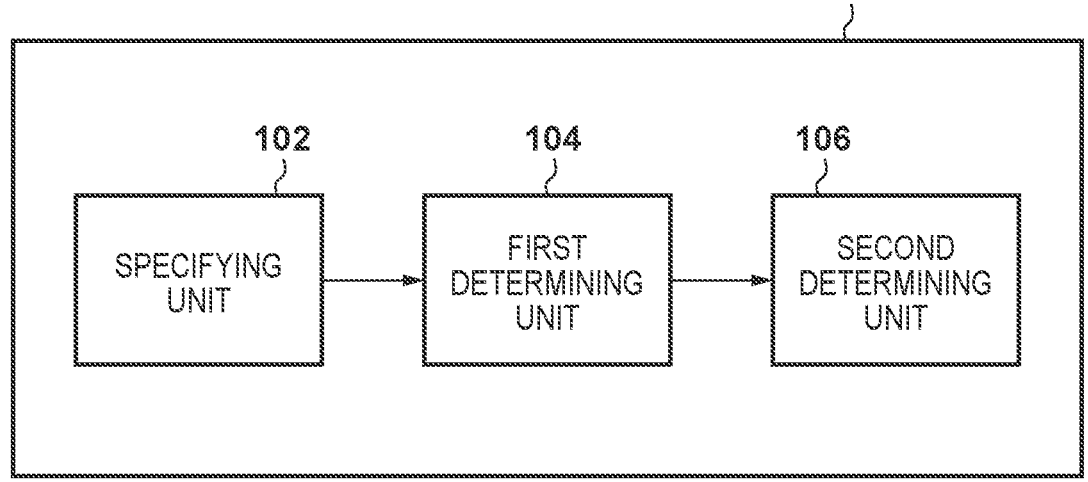
FIG. 7 is a block diagram showing the functions of a control unit.

FIG. 7 is a block diagram showing the functions of the control unit CNT concerning a process of determining the supply position of the imprint material IM in the peripheral shot region SRA in this embodiment. As shown in FIG. 7, the control unit CNT includes a specifying unit 102, a first determining unit 104, and a second determining unit 106. Note that the process of determining the supply position of the imprint material IM in the peripheral shot region SRA may be performed by the control unit CNT of the imprint apparatus 100 as in this embodiment, or may be performed by an information processing apparatus external to the imprint apparatus 100.

First, the surface structure in the wafer edge region of the substrate S on the substrate stage is detected. Here, the wafer edge region of the substrate S is a region including at least the boundary of the effective region VA. The wafer edge region of the substrate S may also include the edge of the substrate S. For example, the image capturing unit IS can be used to detect the surface structure in the wafer edge region of the substrate S. The image capturing unit IS captures the wafer edge region of the substrate S to obtain an image, and inputs the image to the specifying unit 102.

Then, the specifying unit 102 specifies the effective region VA from the surface structure in the wafer edge region of the substrate S. More specifically, the specifying unit 102 performs image processing on the image obtained by the image capturing unit IS, and specifies the effective region VA from an image of the wafer edge region included in the image.

Then, the first determining unit 104 determines the shape of the peripheral shot region SRA based on the effective region VA specified by the specifying unit 102. For example, the first determining unit 104 determines the shape of the peripheral shot region SRA by applying the effective region VA specified by the specifying unit 102 to the outer shape of the substrate S measured by the substrate aligner PA and shot information indicating the array of the shot regions on the substrate.

Then, the second determining unit 106 determines the supply position of the imprint material in the peripheral shot region SRA based on the shape of the peripheral shot region SRA determined by the first determining unit 104. At this time, the second determining unit 106 determines the supply position of the imprint material IM in the peripheral shot region SRA such that no imprint material IM protrudes to the outside of the mold M or the outside of the peripheral shot region SRA when the mold M is brought into contact with the imprint material IM on the substrate. Further, the second determining unit 106 determines the supply position of the imprint material IM in the peripheral shot region SRA such that the pattern region P (concave portion) of the mold M is sufficiently filled with the imprint material IM in a state in which the imprint material IM on the substrate and the mold M are in contact with each other.

With reference to FIGS. 8A to 8E, the supply position of the imprint material IM in the peripheral shot region SRA determined in this embodiment will be specifically described. FIG. 8A is a view showing the supply position (drop pattern) of the imprint material IM in a normal shot region, that is, a shot region (FF: Full Field) whose area is equal to the area of the pattern region P of the mold M. As shown in FIG. 8B, the second determining unit 106 determines the supply position of the imprint material IM in the peripheral shot region SRA by clipping the supply position of the imprint material IM from the drop pattern shown in FIG. 8A in accordance with the shape of the peripheral shot region SRA. As shown in FIG. 8C, in consideration of the filling property of the imprint material IM, the supply position of the imprint material IM in the peripheral shot region SRA may be determined such that the imprint material IM is arranged up to the edge of the peripheral shot region SRA. As shown in FIG. 8D, in consideration of the filling property of the imprint material IM and the distance from the edge of the substrate S, the supply position of the imprint material IM in the peripheral shot region SRA may be determined such that the imprint material IM is arranged up to the outside of the peripheral shot region. As shown in FIG. 8E, in order to alleviate the step at the boundary between the effective region VA and a region outside the effective region VA, the supply position of the imprint material IM may be determined such that the imprint material IM is additionally arranged in the edge of the peripheral shot region SRA.

When the shape of the peripheral shot region SRA is determined, it is preferable to use the position of the underlying pattern PG, that is, the center PC of the underlying pattern PG. In this case, the specifying unit 102 specifies, from the marks SMK on the substrate detected by the alignment scope AS, the center PC of the underlying pattern PG formed on the substrate. Then, based on the effective region VA (center VC thereof) specified by the specifying unit 102 and the center PC of the underlying pattern PG, the first determining unit 104 determines the shape of the peripheral shot region SRA.

As has been described above, in this embodiment, the effective region VA (the center VC of the effective region VA) and the center PC of the underlying pattern GP on the substrate are specified and, from the positional relationship therebetween, the shape of the peripheral shot region SRA is determined. Since the shape of the peripheral shot region SRA is determined in consideration of the error factors (shifts) described with reference to FIGS. 3 to 6, the accuracy of the shot area is guaranteed, so that it is possible to reduce a case in which the imprint material IM is excessive or insufficient for the shot area. Then, based on the shape of the peripheral shot region SRA determined as described above, the supply position of the imprint material IM in the peripheral shot region SRA is determined. Thus, also in the peripheral shot region SRA, no imprint material IM protrudes to the outside of the mold M or the outside of the peripheral shot region SRA and the pattern region P (concave portion) of the mold M is sufficiently filled with the imprint material IM. Therefore, the imprint apparatus 100 can suppress occurrence of transfer failure of the pattern formed on the substrate and contamination of the substrate stage SS or the substrate conveyance unit STU by the imprint material IM.

Note that in this embodiment, the image capturing unit IS is used to detect the surface structure in the wafer edge region of the substrate S, but the focus sensor FS that measures the height of the substrate S may be used to detect the surface structure in the wafer edge region of the substrate S. As has been described above, in general, a step is formed at the boundary between the effective region VA and a region outside the effective region VA. Accordingly, by specifying the step at the boundary between the effective region VA and the region outside the effective region VA from the height (height portion) of the wafer edge region of the substrate S measured by the focus sensor FS, the effective region VA can be specified.

Alternatively, it is also possible to use the alignment scope AS, that detects the marks SMK on the substrate, to detect the surface structure in the wafer edge region of the substrate S. Therefore, the same detection unit, that is, the alignment scope AS can be used to detect both the surface structure in the wafer edge region of the substrate S and the position of the underlying pattern PG.

Further, the first determining unit 104 may determine the shape of the peripheral shot region SRA based on the outer shape of the substrate S obtained from the position of the edge of the substrate S in addition to the effective region VA (center VC thereof) specified by the specifying unit 102. For example, if the distance between the effective region VA on the substrate and the edge of the substrate S is small, the region (application region) to which the imprint material IM is supplied may be set so as to be located inside the boundary of the effective region VA. If the distance between the effective region VA on the substrate and the edge of the substrate S is large, the region to which the imprint material IM is supplied may be set so as to be located outside the boundary of the effective region VA. In such a case, it is useful to determine the shape of the peripheral shot region SRA also based on the outer shape of the substrate S obtained from the position of the edge of the substrate S. The position of the edge of the substrate S can be obtained, for example, from the image obtained by the image capturing unit IS or the surface structure in the wafer edge region of the substrate S detected by the alignment scope AS. It is also possible to obtain the position (outer shape) of the edge of the substrate S by the substrate aligner PA provided in the substrate conveyance unit STU.

If the shape (outer shape) of the effective region VA is an elliptical shape, the surface structure in at least four positions (four points) in the wafer edge region of the substrate S may be detected. This can specify the effective region VA in a shorter time than in a case in which the surface structure in the entire circumference of the effective region VA is detected.

The pattern of a cured product formed using the imprint apparatus IMP is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile and nonvolatile semiconductor memories such as a DRAM, a SRAM, a flash memory, and a MRAM and semiconductor elements such as an LSI, a CCD, an image sensor, and an FPGA. Examples of the mold are molds for imprint.

The pattern of the cured product is directly used as the constituent member of at least some of the above-described articles or used temporarily as a resist mask. After etching or ion implantation is performed in the substrate processing step, the resist mask is removed.

Figure 9A:
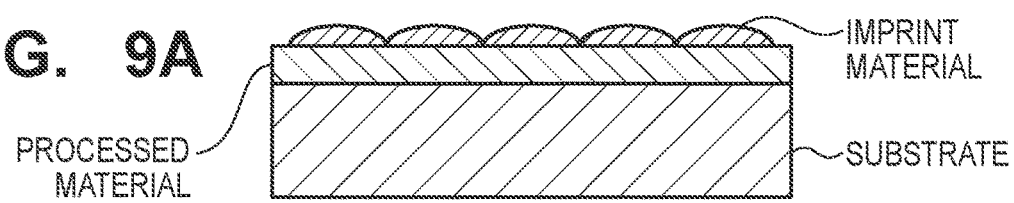
FIGS. 9A to 9F are views for describing an article manufacturing method.

Next, description regarding a detailed method of manufacturing an article is given. As illustrated in FIG. 9A, the substrate such as a silicon wafer with a processed material such as an insulator formed on the surface is prepared. Next, an imprint material is applied to the surface of the processed material by an inkjet method or the like. A state in which the imprint material is applied as a plurality of droplets onto the substrate is shown here.

Figure 9B:
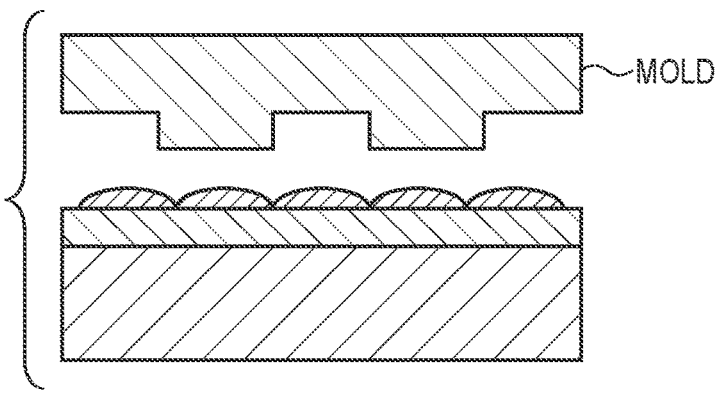
Figure 9C:
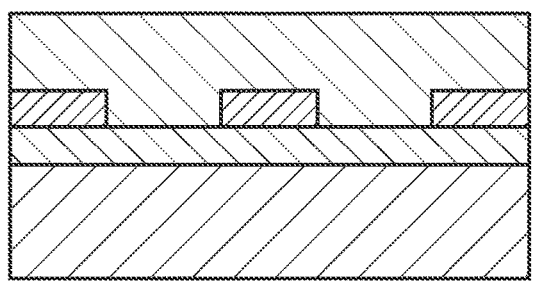

As shown in FIG. 9B, a side of the mold for imprint with a projection and groove pattern is formed on and caused to face the imprint material on the substrate. As illustrated in FIG. 9C, the substrate to which the imprint material is applied is brought into contact with the mold, and a pressure is applied. The gap between the mold and the processed material is filled with the imprint material. In this state, when the imprint material is irradiated with light serving as curing energy through the mold, the imprint material is cured.

Figure 9D:
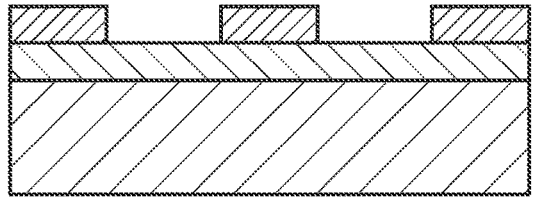

As shown in FIG. 9D, after the imprint material is cured, the mold is released from the substrate. Thus, the pattern of the cured product of the imprint material is formed on the substrate. In the pattern of the cured product, the groove of the mold corresponds to the projection of the cured product, and the projection of the mold corresponds to the groove of the cured product. That is, the projection and groove pattern of the mold is transferred to the imprint material.

Figure 9E:
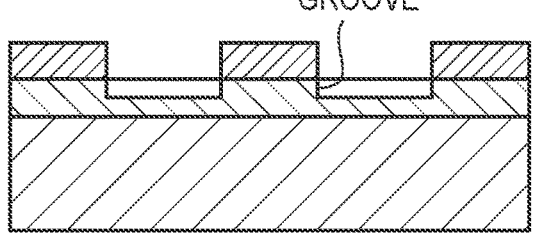
Figure 9F:
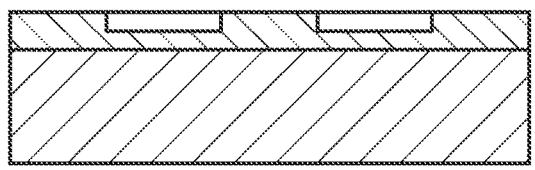

As shown in FIG. 9E, when etching is performed using the pattern of the cured product as an etching resistant mask, a portion of the surface of the processed material where the cured product does not exist or remains thin is removed to form a groove. As shown in FIG. 9F, when the pattern of the cured product is removed, an article with the grooves formed in the surface of the processed material can be obtained. The pattern of the cured material is removed here, but, for example, the pattern may be used as a film for insulation between layers included in a semiconductor element or the like without being removed after processing, in other words as a constituent member of the article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent application No. 2020-048025 filed on Mar. 18, 2020, which is hereby incorporated by reference herein in its entirety.

What is claimed is:

1. An imprint apparatus that forms a pattern of an imprint material on a substrate using a mold, the apparatus comprising:
   a first detection unit configured to detect a surface structure in a wafer edge region of the substrate;
   a specifying unit configured to specify, from the surface structure detected by the first detection unit, an effective region in which the pattern of the imprint material is formed; and
   a first determining unit configured to determine, based on the effective region specified by the specifying unit, a shape of a peripheral shot region whose area is smaller than an area of a pattern region of the mold; and
   a second determining unit configured to determine, based on the shape determined by the first determining unit, a supply position of the imprint material in the peripheral shot region.

2. The apparatus according to claim 1, further comprising a second detection unit configured to detect a mark provided on the substrate,
   wherein the specifying unit specifies, from the mark detected by the second detection unit, a position of an underlying pattern formed on the substrate, and
   the first determining unit determines the shape of the peripheral shot region also based on the position of the underlying pattern specified by the specifying unit.

3. The apparatus according to claim 1, wherein
   the wafer edge region of the substrate includes an edge of the substrate, and
   the first determining unit determines the shape of the peripheral shot region also based on an outer shape of the substrate obtained from a position of the edge of the substrate.

4. The apparatus according to claim 1, further comprising:
   a substrate holding unit configured to hold the substrate;
   a substrate conveyance unit configured to convey the substrate to the substrate holding unit; and
   a third detection unit provided in the substrate conveyance unit and configured to detect a position of an edge of the substrate,
   wherein the first determining unit determines the shape of the peripheral shot region also based on an outer shape of the substrate obtained from the position of the edge of the substrate detected by the third detection unit.

5. The apparatus according to claim 1, wherein
   the second determining unit determines the supply position of the imprint material in the peripheral shot region such that the imprint material does not protrude to an outside of the mold or an outside of the peripheral shot region when the mold is brought into contact with the imprint material on the substrate.

6. The apparatus according to claim 1, wherein
   the first detection unit includes an image capturing unit configured to capture the substrate and obtain an image, and
   the specifying unit specifies the effective region from an image of the peripheral region included in the image obtained by the image capturing unit.

7. The apparatus according to claim 1, wherein
   the first detection unit includes a measurement unit configured to measure a height of the substrate, and
   the specifying unit specifies the effective region from a height of the peripheral region measured by the measurement unit.

8. The apparatus according to claim 1, wherein
   the effective region has an elliptical shape, and
   the first detection unit detects the surface structure in at least four positions in the wafer edge region of the substrate.

9. The apparatus according to claim 2, wherein
   the first detection unit and the second detection unit are the same detection unit.

10. An article manufacturing method comprising:
    forming a pattern on a substrate using an imprint apparatus defined in claim 1;
    processing the substrate on which the pattern is formed in the forming; and
    manufacturing an article from the processed substrate.

* * * * *